US005845380A

United States Patent [19]

Thiel

[11] Patent Number: 5,845,380

[45] Date of Patent: Dec. 8, 1998

[54] METHOD FOR MANUFACTURING A MODULE FOR SHORTER INK JET PRINTING HEAD WITH PARALLEL PROCESSING OF MODULES

[75] Inventor: Wolfgang Thiel, Berlin, Germany

[73] Assignee: Francotyp-Postalia AG & Co., Biekenwerder, Germany

[21] Appl. No.: 820,669

[22] Filed: Mar. 18, 1997

Related U.S. Application Data

[62] Division of Ser. No. 570,677, Dec. 11, 1995, Pat. No. 5,752,303, which is a division of Ser. No. 229,585, Apr. 19, 1994, abandoned.

[30] Foreign Application Priority Data

Oct. 19, 1993 [DE] Germany .......................... 43 36 416.0

[51] Int. Cl.[6] .............................. H01L 41/22; B41J 2/01; B41J 2/14; B41J 2/16

[52] U.S. Cl. ............................ 29/25.35; 29/417; 29/469; 29/890.1; 216/27; 310/367; 347/40; 347/47; 347/63; 347/70

[58] Field of Search ............................... 29/25.35, 890.1, 29/414–417, 469; 216/27; 310/367, 368; 347/40, 47, 63, 68, 70; 451/8, 41

[56] References Cited

U.S. PATENT DOCUMENTS

| | | | |
|---|---|---|---|
| 4,216,477 | 8/1980 | Matsuda et al. | 347/47 X |
| 4,422,082 | 12/1983 | Louzil | 347/47 |
| 4,525,728 | 6/1985 | Koto | 347/70 |
| 4,601,777 | 7/1986 | Hawkins et al. | 216/27 |
| 4,611,219 | 9/1986 | Sugitani et al. | 347/40 |
| 4,635,079 | 1/1987 | Hubbard | 347/68 |
| 4,641,153 | 2/1987 | Cruz-Uribe | 347/68 |
| 4,680,595 | 7/1987 | Cruz-Uribe et al. | 347/40 |
| 4,695,854 | 9/1987 | Cruz-Uribe | 347/40 |

(List continued on next page.)

FOREIGN PATENT DOCUMENTS

| | | |
|---|---|---|
| 0 326 568 | 10/1981 | European Pat. Off. . |
| 0 326 568 | 10/1987 | European Pat. Off. . |
| 0 370 776 | 5/1990 | European Pat. Off. . |
| 0 457 557 | 11/1991 | European Pat. Off. . |
| 0 535 772 | 4/1993 | European Pat. Off. . |
| 0 564 295 | 10/1993 | European Pat. Off. . |
| OS 32 22 636 | 1/1983 | Germany . |
| OS 34 45 761 | 6/1985 | Germany . |
| OS 38 03 432 | 8/1989 | Germany . |

(List continued on next page.)

OTHER PUBLICATIONS

"Manufacturing Nozzles, Charging Plates and Deflection Assemblies Into A Prealigned System," Lane, IBM Technical Disclosure Bulletin, vol. 17, No. 5, Oct., 1974, pp. 1525–1526.

"Wafer Separation Into Nozzle Plates By Etching," Delaney et al., IBM Technical Disclosure Bulletin, vol. 20, No. 3, Aug., 1977, pp. 1193–1195.

"Ink Jet Nozzle," (author unattributed) vol. 29, No. 4, Sep., 1986, pp. 1767–1768.

*Primary Examiner*—Peter Vo
*Attorney, Agent, or Firm*—Hill & Simpson

[57] ABSTRACT

An ink jet printing head that, based on the face shooter principle, contains a nozzle row arranged in the z-direction in the surface of a plate, allowing an ink jet to be ejected in the y-direction, a membrane plate arranged on a first chamber plate carrying the ink chambers, and paths for delivering and actuators for expelling ink from each chamber. The ink jet printing head also has a second chamber plate in a different level from the first chamber plate. The chambers of the second chamber plate are arranged offset in the x- and z-directions relative to the chambers of the first chamber plate. The overlap of chambers of neighboring levels becomes minimal as a result. After a pre-treatment of the plate material of which the printing head is constructed, a masking and etching of the plates ensues in a parallel plate processing for all individual parts. Separated, finished discrete parts are joined and contacted to form a module.

5 Claims, 10 Drawing Sheets

U.S. PATENT DOCUMENTS

| | | | |
|---|---|---|---|
| 4,703,333 | 10/1987 | Hubbard | 347/40 |
| 4,730,197 | 3/1988 | Raman et al. | 347/40 |
| 4,752,788 | 6/1988 | Yasuhara et al. | 310/367 X |
| 4,769,654 | 9/1988 | Tanaka et al. | 347/40 |
| 4,812,859 | 3/1989 | Chan et al. | 347/63 |
| 4,835,554 | 5/1989 | Hoisington et al. | 347/68 X |
| 4,922,271 | 5/1990 | Nillson et al. | 347/40 X |
| 4,942,409 | 7/1990 | Paton et al. | 347/68 X |
| 5,028,514 | 7/1991 | Johannsen | 430/320 |

FOREIGN PATENT DOCUMENTS

| | | | |
|---|---|---|---|
| OS 38 05 279 | 8/1989 | Germany . | |
| OS 39 17 434 | 11/1989 | Germany . | |
| OS 42 25 799 | 2/1994 | Germany . | |
| 3092355 | 4/1991 | Japan | 29/890.1 |
| 5000513 | 1/1993 | Japan | 29/890.1 |
| 5269995 | 10/1993 | Japan | 29/890.1 |
| 1 416 980 | 12/1975 | United Kingdom . | |
| 9209111 | 5/1992 | WIPO | 29/25.35 |

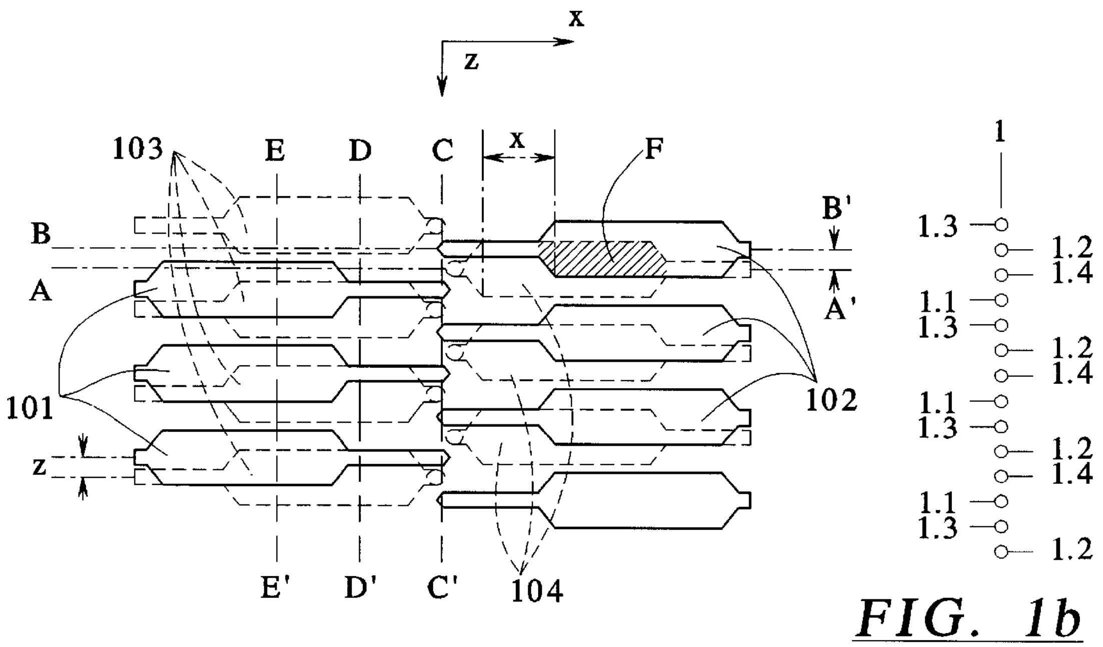
FIG. 1a
FIG. 1b
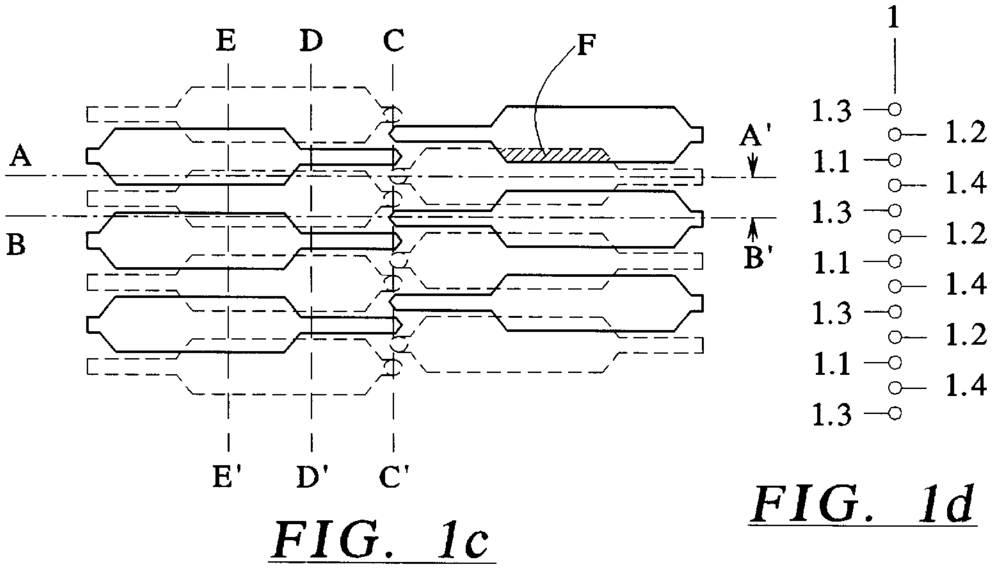
FIG. 1c
FIG. 1d

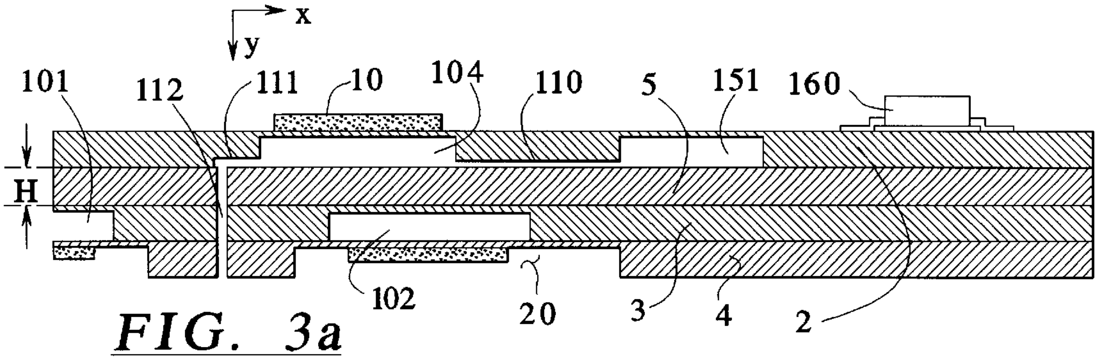
FIG. 3a
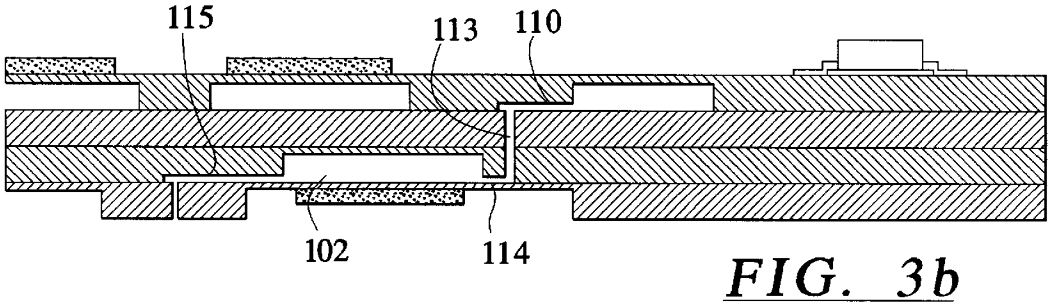
FIG. 3b
FIG. 3c
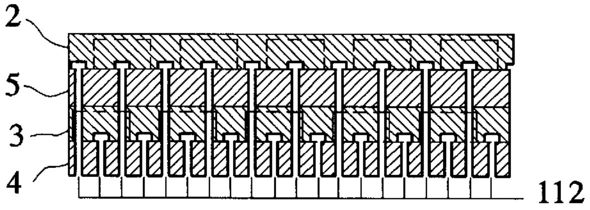
FIG. 3d
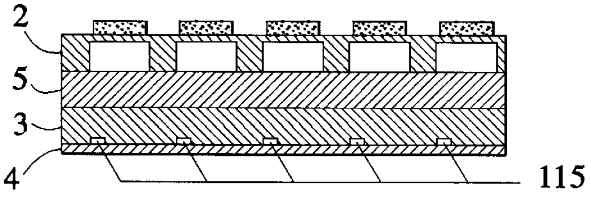
FIG. 3e
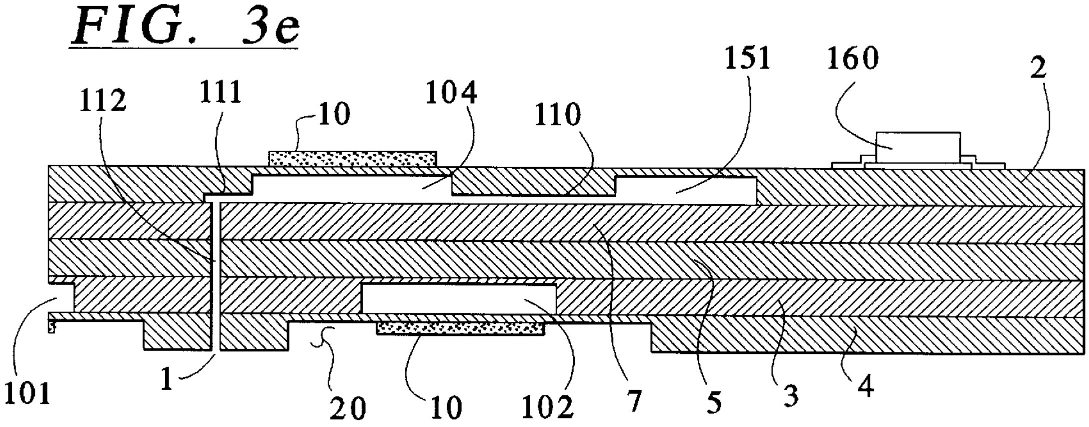

FIG. 4a
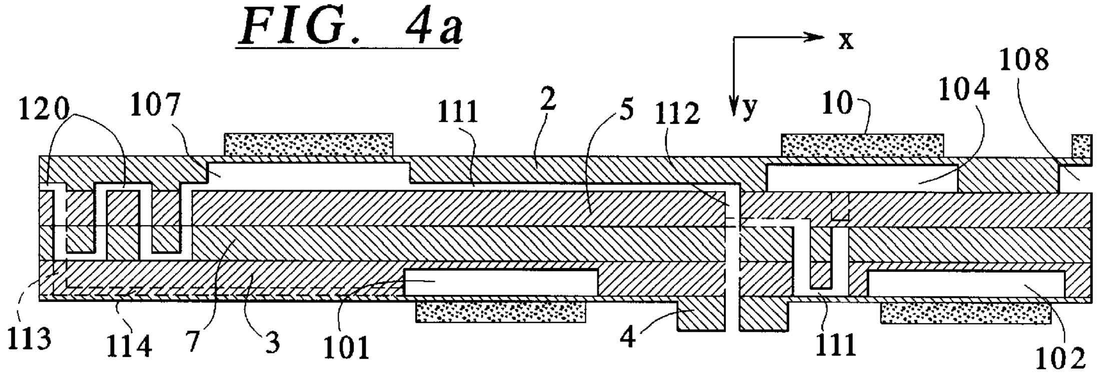
FIG. 4b
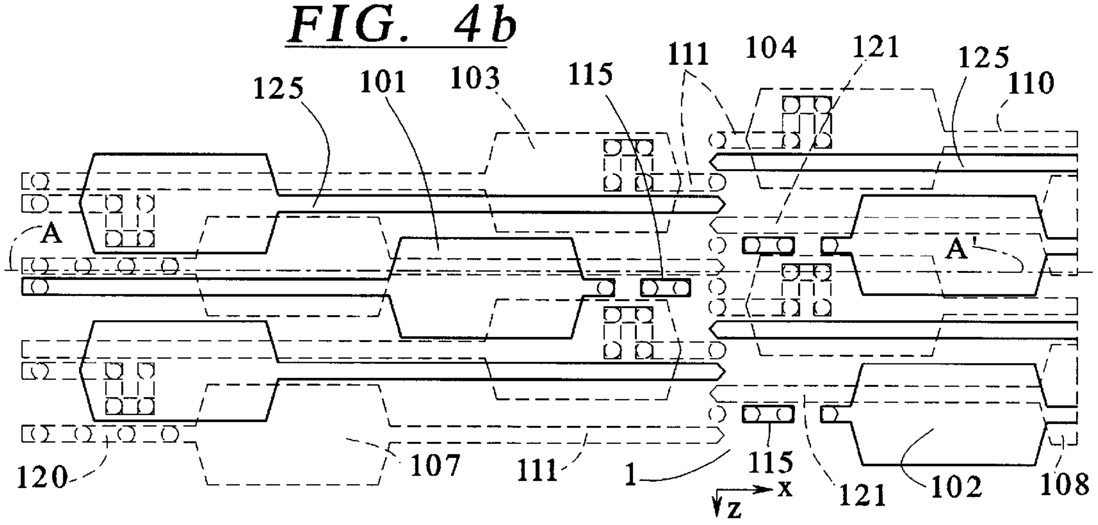
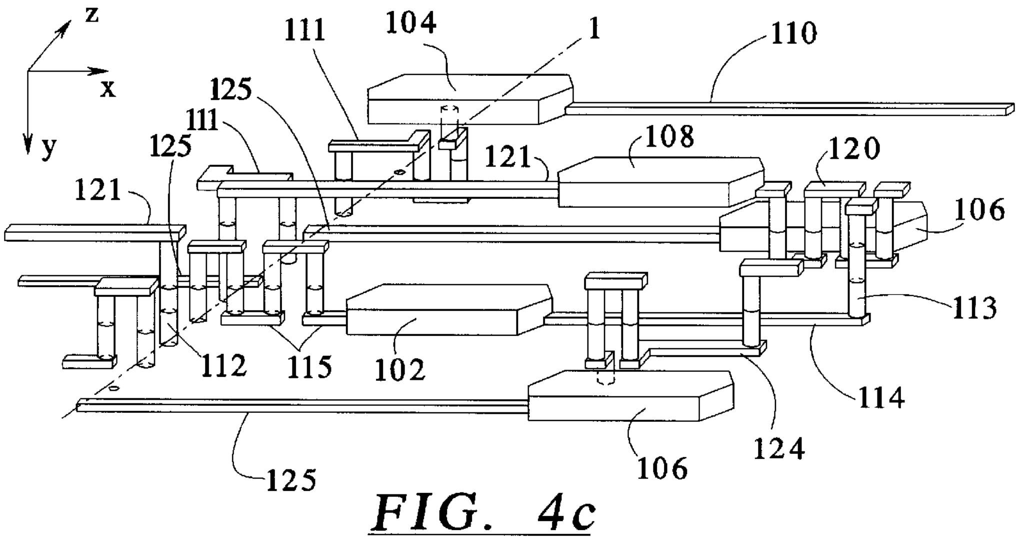
FIG. 4c

*FIG. 7a*

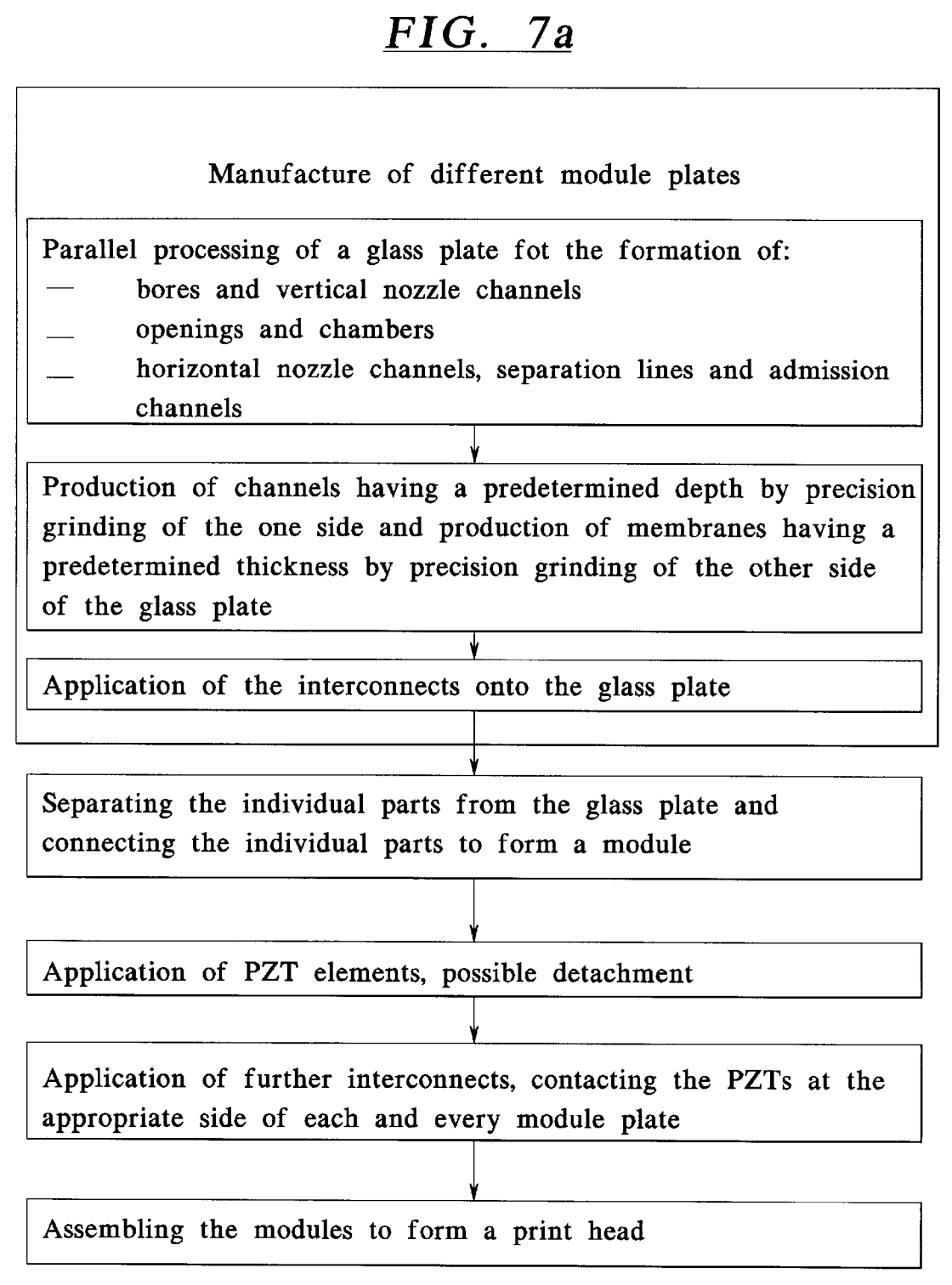

Manufacture of different module plates

Parallel processing of a glass plate fot the formation of:
- bores and vertical nozzle channels
- openings and chambers
- horizontal nozzle channels, separation lines and admission channels

↓

Production of channels having a predetermined depth by precision grinding of the one side and production of membranes having a predetermined thickness by precision grinding of the other side of the glass plate

↓

Application of the interconnects onto the glass plate

↓

Separating the individual parts from the glass plate and connecting the individual parts to form a module

↓

Application of PZT elements, possible detachment

↓

Application of further interconnects, contacting the PZTs at the appropriate side of each and every module plate

↓

Assembling the modules to form a print head

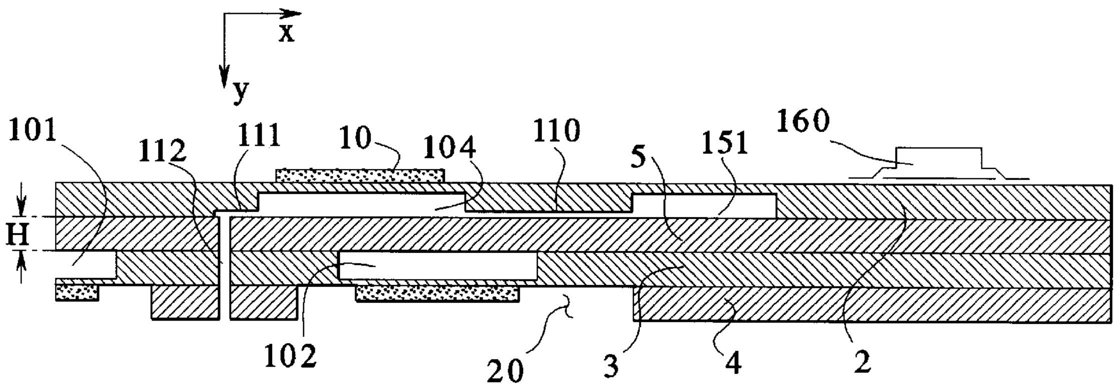
*FIG. 8*
*FIG. 9*
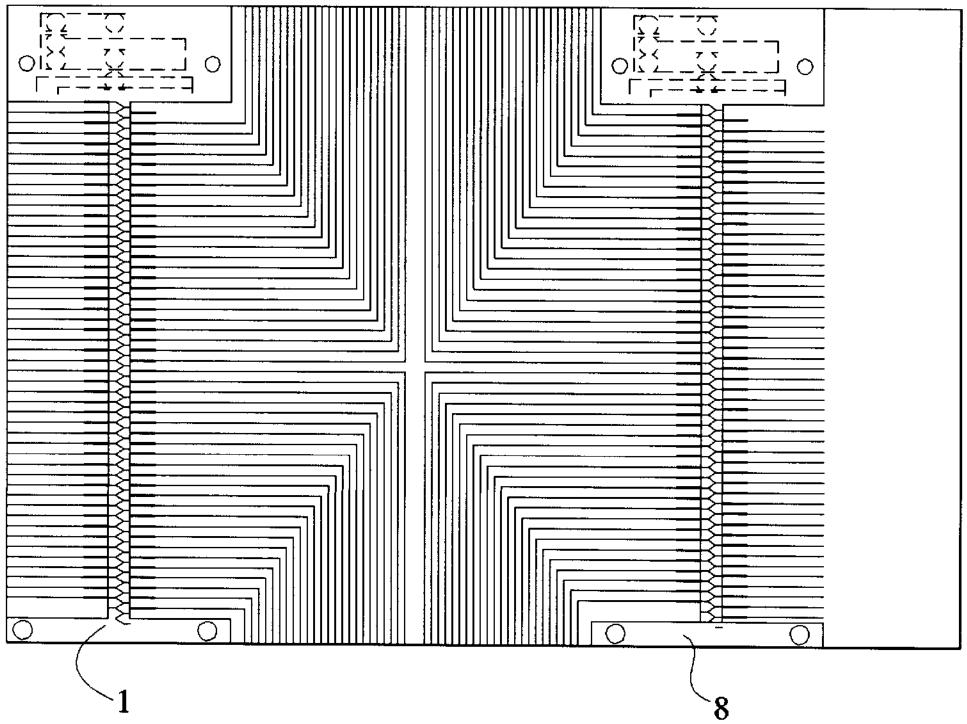

METHOD FOR MANUFACTURING A MODULE FOR SHORTER INK JET PRINTING HEAD WITH PARALLEL PROCESSING OF MODULES

This is a division of application Ser. No. 08/570,677, filed Dec. 11, 1995 now U.S. Pat. No. 5,752,303, which is a division of application Ser. No. 08/229,585 filed Apr. 19, 1994 now abandoned.

BACKGROUND OF THE INVENTION

1. Field of the Invention

The present invention is directed to a face shooter ink jet printing head and to a method for the manufacture thereof.

2. Description of the Prior Art

Ink jet printer heads are employed in small, fast printers, for example, postage meter machines for franking postal items.

Ink jet printing heads can be constructed according to the edge shooter principle or according to the face shooter principle (First Annual Ink Jet Printing Workshop, Mar. 26–27, 1992, Royal Sonesta Hotel, Cambridge, Mass.). Heretofore, efforts were directed to minimizing the dimensions of the chambers in order to increase the nozzle density. These measures, however, are only meaningful given ink jet modules having a few nozzles in a row and are not useful given a high number of nozzles.

German OS 32 48 087 discloses a face shooter liquid jet head, one version of which has nozzle groups lying in a nozzle line such that neighboring lead-zirconate-titanate elements (PZT elements) are separately supplied with fluid. A manifold-like branching of the ink channels leads from the delivery channel to the elements at each side. The longitudinal axes of the ink chambers lie in the direction of the ink jet emission from the face shooter nozzles. The width of the chamber size under the PZT elements is limited by this arrangement and a high nozzle density is not achieved.

Ink jet printing heads according to the face-shooting principle that were developed later, as disclosed, among others, in U.S. Pat. No. 4,730,197, U.S. Pat. No. 4,703,333, U.S. Pat. No. 4,695,584, U.S. Pat. No. 4,635,079, U.S. Pat. No. 4,641,153 and U.S. Pat. No. 4,680,595 are likewise composed of ink chambers that are orthogonally arranged relative to the longitudinal axis of the ink chambers to the left and right of a line of nozzle exit openings. The ink chambers all have their longitudinal axis lying in one plane. In this arrangement, as in the aforementioned arrangement, the achievable density in the arrangement of the nozzles is defined by the width of the chambers and by the thickness of the partition lying between two chambers. This partition cannot fall below a specific minimum thickness because otherwise cross-talk occurs. The arrangement which is undertaken at both sides of and symmetrically relative to the nozzle line only achieves a doubling of the nozzle density. Geometrical resolutions of 64 dpi can be currently achieved with such arrangements. This resolution, however, is not adequate for printing graphic symbols as required, for example, by label printers or postage meter machines.

In particular, U.S. Pat. No. 4,680,595 discloses a manufacturing method for a face shooter ink jet printing head having a nozzle line between two groups of ink chambers which has double the nozzle density. A chamber plate that carries the chambers in a symmetrical arrangement relative to the nozzle line is produced and a diaphragm plate is to be positioned on this later. A single PZT layer is secured over the diaphragm plate and is subsequently separated into discreet PZT elements by removing material. Subsequently, the diaphragm plate is positioned over the chamber plate and secured, with a number of further work plates being arranged thereunder.

Every rectangular chamber has a delivery channel and a nozzle as well as an oscillation plate with a piezo-ceramic element allocated to it. A disadvantage, however, is that the pressure waves occurring in the ink delivery and in each chamber can cause cross-talk onto further printing chambers. This cross-talk can be subsequently eliminated only as a result of extremely complicated measures, so that these ink jet printing heads are ultimately composed of many individual plates that must be manufactured in a complicated and expensive manufacturing process.

German 34 45 761 likewise discloses a method for manufacturing a transducer arrangement composed of a single plate of transducer material. After coating the lower surface of the plate with a diaphragm layer, a removal of material from the upper surface of the plate of the transducer material ensues in order to generate separate regions that are arranged on the diaphragm above every printing chamber (area: 25.4 mm×2.54 mm). The necessity of producing adhesion between the individual transducer elements and the diaphragm with glue is thus eliminated and the uniformity of all spacings is improved. The resulting nozzle spacing, however, continues to be relatively large in a printing head manufactured in this way.

U.S. Pat. No. 4,703,333 also discloses ink jet printing heads manufactured with face shooter modules arranged obliquely offset above one another, producing for an inclined arrangement relative to the surface of recording medium. Ink jet printing heads having an inclined arrangement relative to the surface of a recording medium produce a more uniform recording even given a fluctuating thickness of the recording medium. The manufacture of such printing heads, however, requires a multitude of manufacturing steps. It is difficult to assure the required precision given such a complicated overall structure of each and every printing head. The electrical drive of such printing heads having nozzle rows offset relative to one another which is required during operation is just as complicated. Due to a required, minimum size of the ink chambers, the minimum spacings between the nozzles cannot be additionally reduced even given a mutually offset arrangement of two rows of chambers having nozzles with a slight nozzle density in each nozzle row.

Twice the nozzle density in one row (compared to the density achieved in face shooter ink jet modules with two groups of ink chambers arranged symmetrically relative to the nozzle line) is achieved in a different way in the solution disclosed in U.S. Pat. No. 4,525,728, for an edge-shooter ink jet printing module having one respective nozzle row per chamber plate. Under certain circumstances, the dimensions of the chambers and channels can be further miniaturized. The longitudinal axes of the relatively long ink chambers thereby lie in the direction of the ink jet, whereas the width of the ink chambers is extremely diminished. A problem which then arises, however, is the manufacturing step of applying the PZT elements. The tolerances to be observed are extremely small.

In order to achieve twice the imaging density, it has been proposed in pending German Application P 42 25 799.9 to arrange a plurality of chambers offset horizontally and vertically relative to one another. In this arrangement, however, the channels leading to the nozzles from the distant, lowest level are longer than the channels from the upper, closer level, leading to a phase shift of the individual ink jets that must be electronically compensated. Moreover, the piezo-crystals must exert greater forces due to the extremely long channels, so that these are more likely to fail than other piezo-crystals. In the face shooter ink jet printing head, the channel lengths are shorter and essentially identical as a result of a symmetrical arrangement of all ink chambers in one plane, so that the disadvantage as set forth above is avoided, but at the expense of the resolution.

SUMMARY OF THE INVENTION

An object of the present invention is to provide a compact ink jet printing head with high resolution that does not exhibit the disadvantages of the prior art. A further object is to create a manufacturing method for such an ink jet printer head having low manufacturing costs. Slight differences in size or material between the glass pieces should not lead to deviations of the nozzle shape and position.

The above object is achieved in accordance with the principles of the present invention in a face shooter ink jet printer head having a nozzle plate with a nozzle row extending in the z-direction for ejecting ink in the y-direction, the nozzle row containing nozzles grouped in a plurality of nozzle groups, and first and second channel plates. The first channel plate is disposed at a first level relative to the nozzle plate and contains a plurality of ink-containing chambers arranged in a first plurality of chamber groups. The second chamber plate is disposed at a second level relative to the nozzle plate, between the nozzle plate and the first chamber plate, and contains a plurality of ink chambers disposed at a side thereof facing the nozzle plate, arranged in a second plurality of chamber groups. Each nozzle is connected to one ink chamber by means of an ink channel. The nozzle groups are respectively allocated to chamber groups in the first and second pluralities of chamber groups. The chambers in each chamber group in the second chamber plate are offset in the x- and z-directions relative to the chambers in each chamber group in the first channel plate, so that chambers in the second plurality of chamber groups partially overlap respective one of the chambers in the first plurality of chamber groups. In other words, all chambers in a given chamber group in one plate will respectively partially overlap the chambers in a given chamber group in the other chamber plate. Moreover, the chambers are arranged in the respective chamber plates so that each of the channels running between the respective chambers and a nozzle have substantially the same length, and the chambers are also arranged so that the amount of the overlap is a minimum, so as to minimize cross-talk effects. Actuators, such as piezoelectric elements, are respectively allocated to each chamber to cause the ejection of ink from the nozzle connected to that chamber.

Heretofore, disadvantages could be expected when ink chambers in a plurality of levels were disposed above one another. A cross-talk effect between the levels could in fact be theoretically reduced when an adequately thick spacer layer is arranged between the levels. Pressure differences would then arise, however, between the chamber groups of levels relatively far apart in vertical terms, these pressure differences ultimately preventing a clean impression. This problem has been overcome by the arrangement of the invention. A second level with ink chambers is now arranged under a first level wherein a first group of ink chambers lies, such that the ink chambers of the second level exhibit an offset relative to the nozzle line as well as a lateral offset compared to the ink chambers of the first level.

The invention presumes that a higher nozzle density can be achieved for a face shooter ink jet printing head completely independently of the dimensions of the ink chambers on the basis of this inventive solution of having ink chambers arranged horizontally and vertically offset. An approximately identical channel length is thereby achieved by a defined offset of the ink chamber group relative to the nozzle line within each and every level, which compensates the differently constituted channel length caused by vertical offset of the levels.

This vertical offset is adequate for supplying the respective allocated nozzles with ink on the basis of the channels proceeding in nozzle direction. Channels of a first type connect the ink chambers of the first level to the nozzle plate. Channels of second type connect the ink chambers of the second level to the nozzle plate through the chamber plate lying in the first level.

In the structure of the invention nozzles are to be supplied with ink, which nozzles lie between those nozzles that are supplied by the ink chambers of the first level. The two groups of nozzles form a dense line of equidistant nozzles in the z-direction, Differences that would lead to a distortion of the printing format must thus be compensated.

The arrangement of the chambers relative to the nozzle line and relative to a suction space therefore ensues such that ink channels (nozzle channels and admission channels) of different lengths are provided, but the sum of the ink channel lengths is approximately constant per chamber.

The ink chambers of the first level form a first chamber group which is communication with its associated nozzle group via nozzle channels. Likewise, the ink chambers of the second level form a second chamber group which is in communication with its associated nozzle group via admission channels. Ink chambers of further levels can be brought into communication with further nozzle groups via channels of the second type in the same way.

Third and/or fourth chamber groups are provided in a known way, these lying symmetrically relative to the first and second chamber groups of the chamber plate with respect to the nozzle row that is arranged in the middle of a module at the printing side.

In one embodiment, chambers of a further chamber group are additionally symmetrically arranged relative to the nozzle line with respect to the aforementioned chamber groups in at least the first level, additional ink chambers of the further level lying under the chambers of said further chamber group laterally offset in the z-direction and offset in x-direction relative to the nozzle line.

The dimensions of the individual ink chambers can now even be enlarged as a result of these additional chambers arranged offset in the level, without the nozzle density having to be reduced.

Compared to the known design of having chambers placed in one plane and lying symmetrically at both sides of the nozzle line, a greater width given higher resolution is possible due to the further level and the horizontal offset in the x, z-direction in each level. In the limiting case, the chamber width can be doubled given the same nozzle density. Alternatively, the nozzle density can be doubled given the same chamber width in the other limiting case.

In a preferred version of the invention, the ink jet printing head is constructed of only one module that contains chambers in at least one chamber plate arranged in a plurality of rows parallel to the nozzle line at different distances. The distances are bridged by channels that lie within the module and thus partially lie between the chambers. The respectively nozzle channels from the chambers to the nozzles exhibit a defined, identical, first flow resistance, and while the respective admission channels from the suction space to the chambers a defined, identical, second flow resistance. This can be achieved even though the channels in the vertical direction extend through a plurality of levels to the chambers, or to the nozzles, by making all channels of one type have the same length, given the same cross-section. Each nozzle channel has a defined, lower, first flow resistance than each admission channel. This can likewise be additionally achieved by selective modifications in cross-section and/or turns in the horizontal direction.

Parallel manufacturing method steps ensue for all module plates in order to manufacture the ink chambers, openings, bores and in order to potentially manufacture the nozzle channels.

The method for manufacturing the ink jet printing head is based on the CAD development of a printing head design. A mask is produced in order to cover a photo-sensitive glass plate with this mask.

A pre-treatment of those parts to be removed later with an etchant ensues. For a phase conversion (developing), the masked glass plate is subjected at least once to an irradiation with ultraviolet light of an appropriate wave length having subsequent thermal treatment.

In a following treatment process, the regions to be removed are preferably etched out of every plate. The duration of the etching bath defines the layer thickness of the removed material. The layer thickness of the diaphragm remaining during etching is monitored. When a predetermined layer of thickness is reached, the surface is treated, or a defined diaphragm thickness is set by precision grinding.

The diaphragm plate and a chamber plate are provided with interconnects for the PZT elements to be applied later. Three discrete parts, composed of two chamber parts and at least one further plate which simultaneously serves as a spacer, are aligned and attached to one another and are also subsequently tempered, or subjected to the diffusion bonding process.

A special treatment of the nozzle channels, the cavities (chambers) and the nozzle plate of the module ensues before the printing head is provided with driver circuits, and contacts and is mounted.

In a preferred version, a glass plate is directly separated into individual module plates. It is thus possible that a composite of at least two module plates of the same type lying offset side-by-side can remain in place. This has the advantage that the offset of the module plates by half a nozzle spacing relative to one another in the z-direction can be realized with high-precision on the basis of the lithographic process. A resolution on the order of magnitude of up to a maximum of 256 dpi can be achieved due to the increased nozzle density of a maximum of 128 dpi per module plate and due to the union of two module plates. The principle of simultaneously manufacture of a plurality of module plates offset relative to one another and whose union is to remain in place unseparated is only limited by the yield that can be achieved in accord with the process management.

In addition to the increased nozzle density, another advantage of the face shooter ink jet in-line printing head (FSIJIL printing head) is that all nozzles are arranged in the same glass member because corresponding, vertical nozzle channels are etched into the glass member forming the nozzle plate, or are introduced therein by any comparable way before the diffusion bonding process. As a result, it is possible to achieve a constant nozzle size and a constant spacing for all nozzles and to achieve a uniform offset from nozzle line to nozzle line. This reduces the manufacturing costs.

DESCRIPTION OF THE DRAWINGS

FIG. 1*a* is a schematic illustration of a first version of a face shooter ink jet in-line printing (FSIJIL) head in a plan view onto the second chamber plate (nozzle side) constructed in accordance with the principles of the present invention.

FIG. 1*b* shows the nozzle arrangement in the nozzle line according to a first version of the FSIJIL printing head.

FIG. 1*c* is a schematic illustration of a second version of a face shooter ink jet in-line printing head in a plan view onto the second chamber plate (nozzle side).

FIG. 1*d* shows the nozzle arrangement in the nozzle line according to the second version of the FSIJIL printing head.

FIG. 3*a* shows a section along line A–A' of a part of the FSIJIL printing head according to a third version constructed in accordance with the principles of the present invention.

FIG. 3*b* shows a section along line B–B' of a part of the FSIJIL printing head according to the third version.

FIG. 3*c* shows a section along line C–C' of a part of the FSIJIL printing head according to the third version.

FIG. 3*d* shows a section along line D–D' of a part of the FSIJIL printing head according to the third version.

FIG. 3*e* shows a section along line A–A' of a part of the FSIJIL printing head according to a modification of the third version.

FIG. 4*a* shows a section along line A–A' of a part of a FSIJIL printing head according to a fourth version constructed in accordance with the principles of the present invention.

FIG. 4*b* shows the fourth version of a face shooter ink jet in-line printing head in a plan view onto the second chamber plate (nozzle side).

FIG. 4*c* illustrates the ink delivery in perspective view of a detail of the FSIJIL printing head constructed in accordance with the principles of the present invention.

FIG. 7*a* is a flow chart for a first version of a manufacturing method for the FSIJIL printing head of the invention.

FIG. 8 shows a fifth version of the structure of a module of the FSIJIL printing head of the invention.

FIG. 9 shows the arrangement of the interconnects on the nozzle side of a FSIJIL printing head according to a sixth version.

DESCRIPTION OF THE PREFERRED EMBODIMENTS

Figure 2A:
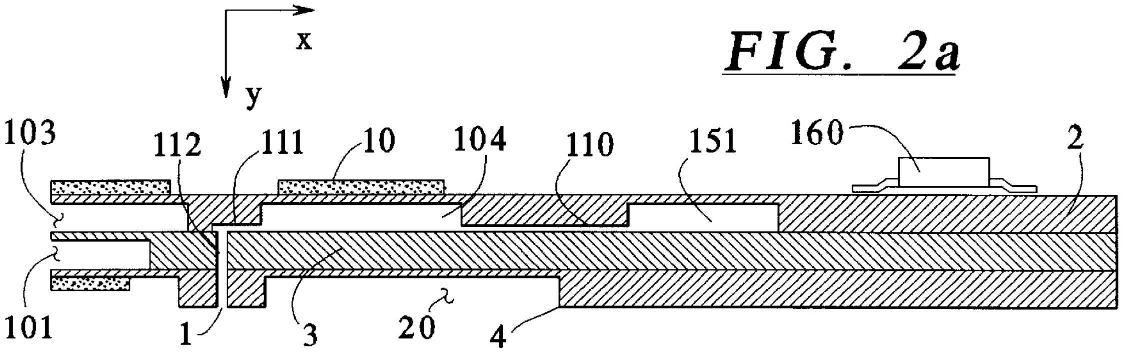
FIG. 2*a* shows a section along line A–A' of a part of the FSIJIL printing head according to the second version of FIG. 1*c*.

FIG. 1*a* and 1*b* and 1*c* and 1*d*, respectively show two versions of the FSIJIL printing head of the invention. The two versions differ only in terms of the sequence of the periodic arrangement of nozzles which are allocated to chambers of the first level and of the second level, of the left and right half of the printing head. Nozzles of the nozzle groups 1.1, 1.2, 1.3 and 1.4 respectively belong to a chamber of the chamber groups 101, 102, 103 and 104.

In FIG. 1*a*, the face shooter ink jet in-line printing head is shown in plan view from the nozzle side onto the inventive, second chamber plate proceeding from the nozzle side in the first version. The chambers of the known, first chamber plate lying therebelow are shown with broken lines in order to illustrate their position relative to the inventive, second chamber plate. The overlap area F of one chamber of the chamber group 102 in the second chamber plate with a chamber of the chamber group 104 in the first chamber plate is shown shaded. The two chambers exhibit an offset of the size X in the x-direction and an offset of the size Z in the z-direction. The individual chamber groups are offset relative to one another in x and z-directions. The nozzles forming the nozzle groups 1.1, 1.2, 1.3 and 1.4 are arranged in a row in the z-direction. The ink drops are ejected in the y-direction orthoginal to the x-and z-directions. The chamber groups 101 and 102 are arranged offset in the x-direction and the chamber groups 103 and 104 are offset in the y-direction orthoginal to x-and z-directions. The nozzle groups are in communication via ink channels with the respective chamber groups 101, 102, 103 and 104 disposed in the chamber plates 3 and 2 in order to deliver the ink. The nozzles of the nozzle groups alternate in the nozzle row with nozzles of the other nozzle groups.

For illustration, FIG. 1*b* shows the nozzle arrangement in the nozzle line according to the first version of the FSIJIL printing head.

In FIG. 1*c*, the face shooter ink jet in-line printing head is shown in a plan view onto the inventive, second chamber plate proceeding from the nozzle side in the second version. The chambers of the known, first chamber plate lying therebelow are likewise indicated with broken lines in order to illustrate their position relative to the inventive, second chamber plate. The overlap area F, however, is smaller than in FIG. 1*a*.

FIG. 1*d* shows the nozzle arrangement in the nozzle line 1 according to the second version of the FSIJIL printing head.

The nozzle row 1 comprises the nozzles belonging to different nozzle groups 1.1, 1.2, 1.3 and 1.4, which alternate such that the overlap of chamber groups of the one level with those of the other level is effective only at the chamber edges.

The overlap area F of each chamber of the chamber group 101 or 102 in the second chamber plate with chambers of the respective chamber group 103 or 104 in the first chamber plate is minimal due to the offsets in the x and z-directions.

The sectional views in FIGS. 2*a*–2*e* show the layered structure of the printing head and the path of the ink flow according to the preferred embodiment of the invention (second version, FIG. 1*c*). A first chamber plate 2 carrying ink chambers lying in a first level is equipped with a delivery manifold 151 and a delivery channel 110 and with actuators 10 for expelling ink from a chamber respectively allocated to one nozzle. In the second version according to FIG. 1*c*, the printing head is composed of only three plates. A group 101, 102, 103 and 104 of ink chambers is worked into each chamber plate 2 and 3 at that side facing toward the nozzle plate 4. The ink jet printing head has a nozzle plate 4 according to the face shooter principle. This has regions 20 that are worked in and that are fashioned as diaphragm on which actuators 10 for expelling ink (PZT elements) are arranged. The nozzle plate 4 functions as a diaphragm plate for the ink chambers of the second level. In addition, it contains the nozzles and nozzle channels 112 in the form of cylindrical through-openings that vertically pass through the nozzle plate. The nozzle plate 4 is arranged on the inventive, second chamber plate that carries the ink chambers and carries a single nozzle row 1 including the nozzle groups 1.1, 1.2, 1.3, 1.4, ... belonging to k chamber groups 101, 102, 103, 104, ..., and which is arranged in the middle of the area of the nozzle plate 4.

Nozzles of nozzle groups 1.1 and 1.2 are connected via ink channels 115 to the allocated chamber groups 101 and 102 disposed in the same chamber plate 3, and at least nozzles of the further nozzles groups 1.3 and 1.4 are connected via through openings 112 and ink channels 111 in the aforementioned, first chamber plate to the associated chambers of further chamber groups 103 and 104.

FIG. 2*a* shows the section A–A' with ink channel guidance from a manifold 151 to an ink chamber 104 of the first level and from the ink chamber 104 to the appertaining nozzle in the nozzle plate 4.

Figure 2B:
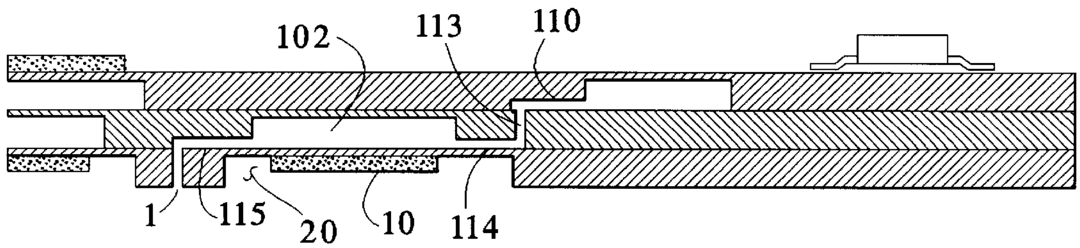
FIG. 2*b* shows a section along line B–B' of a part of the FSIJIL printing head according to the second version of the FSIJIL printing head.

FIG. 2*b*, by contrast, shows a section B–B' with ink channel guidance from the manifold 151 via delivery channels 110, 113 and 114 to an ink chamber 102 of the second level and from the latter to the associated nozzle via the nozzle channels 115 and 112. It can also be seen that the vertically-proceeding connecting channels 112, from the ink chambers of the first chamber plate 2 to the allocated nozzles in the nozzle plate 4, are disposed in the chamber plate 3, in addition to the structure of the ink chambers, the delivery channels from the manifold and the nozzle channel.

The chamber plate 2 contains the structures of the ink chambers and horizontally proceeding ink channels 111 as well as at least one manifold 151 and 152 (See FIG. 5) and a horizontal connecting channel 110 to the manifold 151.

Figure 2C:
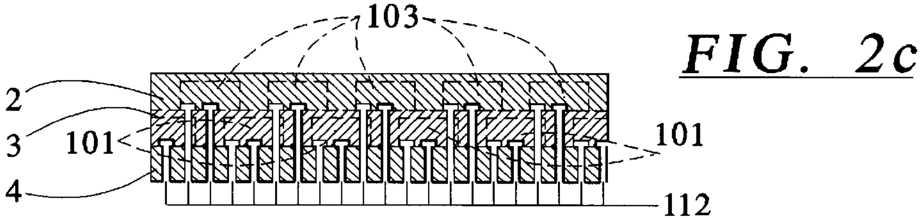
FIG. 2*c* shows a section along line C–C' of a part of the FSIJIL printing head.
Figure 2D:
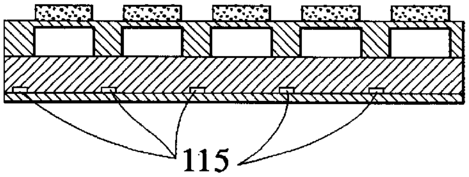
FIG. 2*d* shows a section along line D–D' of a part of the FSIJIL printing head.
Figure 2E:
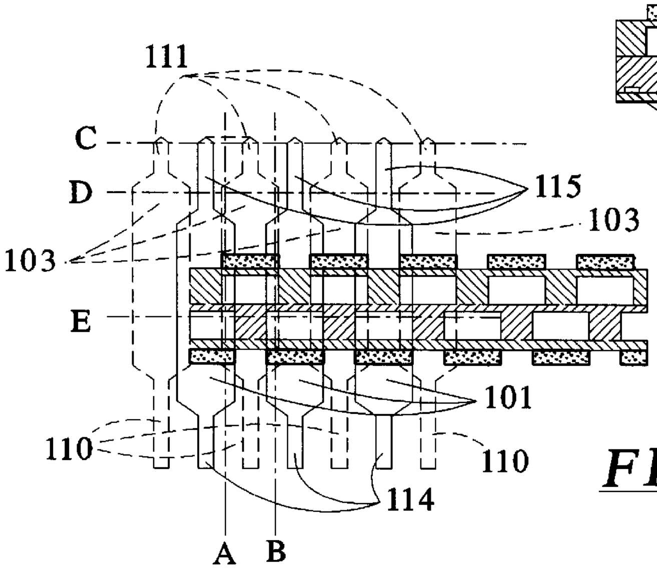
FIG. 2*e* shows a section along line E–E' of a part of the FSIJIL printing head.

The section C–C' shown in FIG. 2*c* is taken along the nozzle line 1 and in the y-direction of the nozzle axis. This view shows how an especially high density is achieved in the arrangement of the nozzles on the basis of the interleaving of the ink channels of the left and right paths of the plan view shown according to FIG. 1*c*. The nozzle channels 112 of the left half are shown boldface. The associated ink chambers 101 and 103 are shown boldface with broken lines. FIG. 2*d* shows a section along the line D–D' of the plan view shown according to FIG. 1*c* for the left half, whereby the section proceeds through the chambers of the first level. In FIG. 2*e*, a section has been taken along the line E–E' onto the left half of the plan view of FIG. 1*c*, whereby the section E–E' proceeds through all chambers of the level of the left half. The through-openings can be produced in various ways, such as by etching, burning through with a laser beam, or punching with special tools. Among other things, the selection of the method is dependent on the material employed.

Since the nozzle plate 4 carries not only the nozzles but also the actuators 10 for changing the volume of the ink chambers, a homogenous connection to the material of the chamber plate lying therebelow is required. In the preferred embodiment of the invention, photosensitive glass is employed as the material for all plates of the printing head. The structuring, including the fashioning of the nozzles, is achieved by a photolithographic process and etching of the exposed parts. The homogenous and tightly joining connection of the plates is produced by thermal diffusion bonding.

FIGS. 3*a*–3*c* show the preferred embodiment of the invention (third version), wherein the offset is selected fundamentally in the way already set forth in FIG. 1a with respect to the first version. In the third version, however, the printing head is composed of more than three plates, with a middle plate 5 having a thickness H placed as spacer plate between the chamber plates 2 and 3. In order to retain an identical nozzle channel length for all ink delivery paths, the offset in the x-direction can also be increased by an amount equal to the thickness H. This enables a further reduction in the overlap of the chambers. The nozzle plate 4 functions as a cover plate for the ink chambers of the second level. In addition, the plate 4 contains the nozzles in the form of cylindrical openings that vertically pass through the plate.

FIG. 3*a* shows a section along the line A–A' shown in FIG. 1*a* for a part of the FSIJIL printing head according to the third version. FIG. 3*b* shows the corresponding section along the line B–B'; FIG. 3*c* shows the section along the line C–C'; and FIG. 3*d* shows the section along the line D–D' for a part of the FSIJIL printing head according to the third version.

In the FSIJIL printing head according to the third version, further spacers can be used in order to enlarge the offset in the x-direction. The offset in the x-direction is defined by the sum of all thicknesses H of the second chamber plate 3 and the spacers (middle plates 7 or 5).

FIG. 3*e* shows the section along the line A–A' shown in FIG. 1*a* for a part of the FSIJIL printing head according to a third version modified in this way with a further spacer plate 7. The corresponding sections along the line B–B' and C–C' for a part of the FSIJIL printing head need not be shown since they are similar to the sections according to the third version.

A further embodiment having a plurality of rows of ink channel groups 101–108 parallel and symmetrical to the nozzle line per level is set forth with reference to FIGS. 4*a*–4*c* (a fourth version). The nozzle density can be doubled in this way. FIG. 4*a* shows a section along the line A–A' of a part of the FSIJIL printing head of the plan view onto the nozzle side of the fourth version shown in FIG. 4*b*. The course of closely arranged ink channels outside the plane of section A–A' is shown with broken lines.

FIG. 4*b* shows the fourth version of a face shooter ink jet in-line printing head in a plan view onto the second chamber plate 3 (nozzle side). The chambers and ink channels lying therebelow in the volume are shown with broken lines.

It may be seen from FIGS. 4*a* and 4*b* that the ink channels lie between the chambers in the volume of the module. Inventively, the spacing between the aforementioned rows of ink channel groups is increased to such an extent within each level that this leads to a further minimization of the overlap area. The offset according to the first, fundamental version of FIG. 1*a* can thus also be applied with a good result.

FIG. 4*c* illustrates the ink paths (guidance) in a perspective view for a detail of the FSIJIL printing head to the right of the nozzle line 1, with reference to FIGS. 4*a* and 4*b*. Every ink channel 111 or 115 includes sections of the ink path in different levels and the ink chambers of the groups 101 and 103 as well as groups 102 and 104 are arranged closer to the nozzle line by a length of path. Conversely, the ink chambers of the additional groups 105 and 107 as well as groups 106 and 108 are arranged closer to the manifolds 151 and 152 and every ink input channel 124 and 120 thus includes sections of the ink path in different levels.

Figure 5:
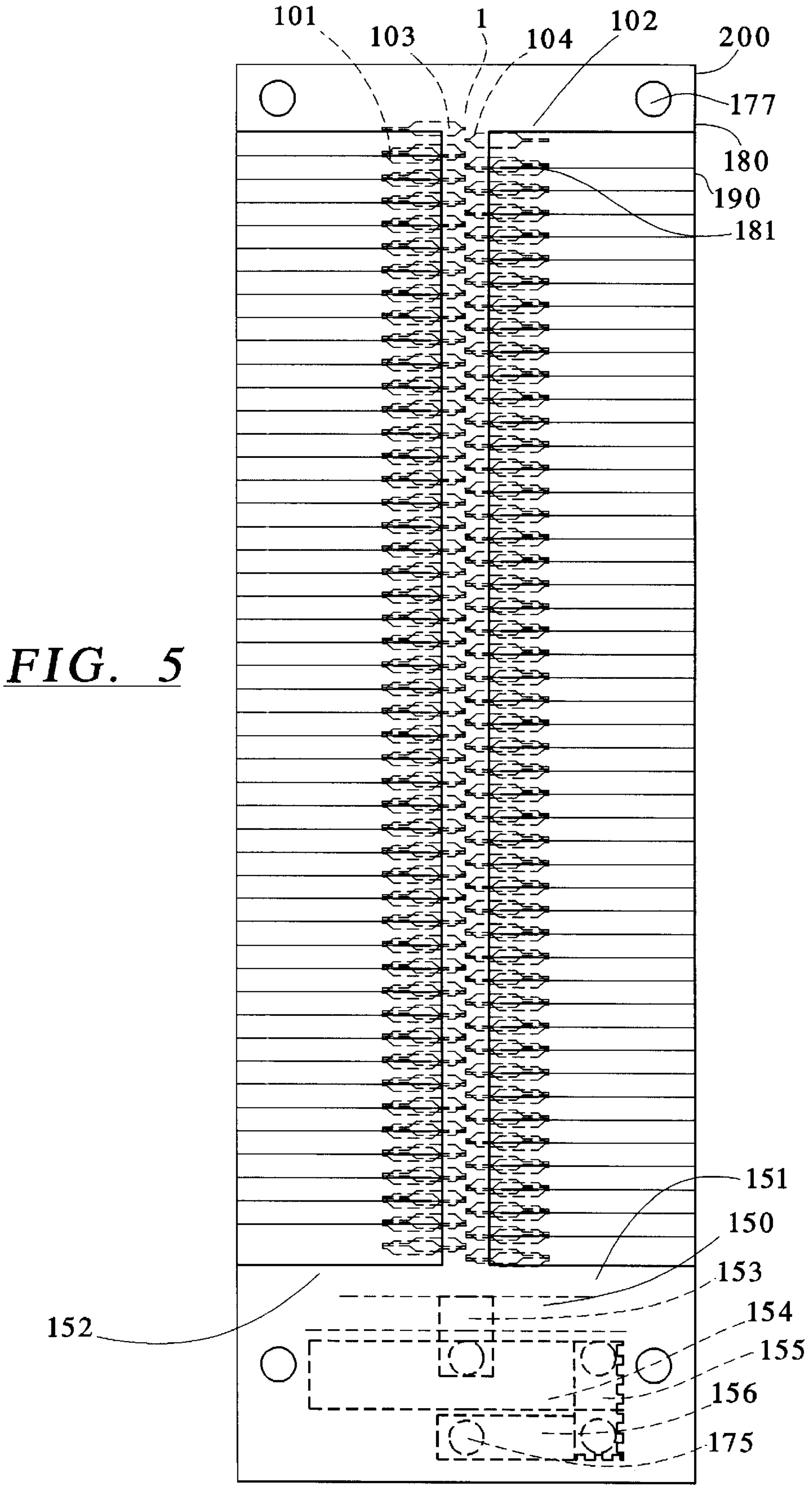
FIG. 5 shows the arrangement of the interconnects on the nozzle side of the FSIJIL printing head according to the first version.

The arrangement of the electrical interconnects for contacting the PZT elements on the nozzle side may be seen from FIGS. 5 and 9. The arrangement of the interconnects on the circuit side is comparable.

On the circuit side, however, the lines from the PZT elements of the second chamber plate are added. For example, type HV04 or HV06 in HVCMOS technology of Supertexinc can be employed as the driver circuit. This includes a 64-bit serial/parallel register having 64 following latches that is connected via NAND or OR gates to 64 CMOS driver stages which can supply an output up to Vs=80 V. The manifold 151 and 152 meet at the periphery of the module to form a space 150 from which a passage 153 leads to a damping element 154 at the surface (circuit side) of the module, which is connected via delivery channels 155 and 156 to an ink supply opening. The module 200 shown in FIG. 5 has bores 177 for fastening the module and grounding runs 180 connected to electrode surfaces 181. The respective PZT crystals are arranged and contacted on the surfaces 181. The other electrode on the surface of the PZT crystal is connected via a bond wire to an associated conductor run 190 which leads to the corresponding output of the driver circuit.

Figure 6:
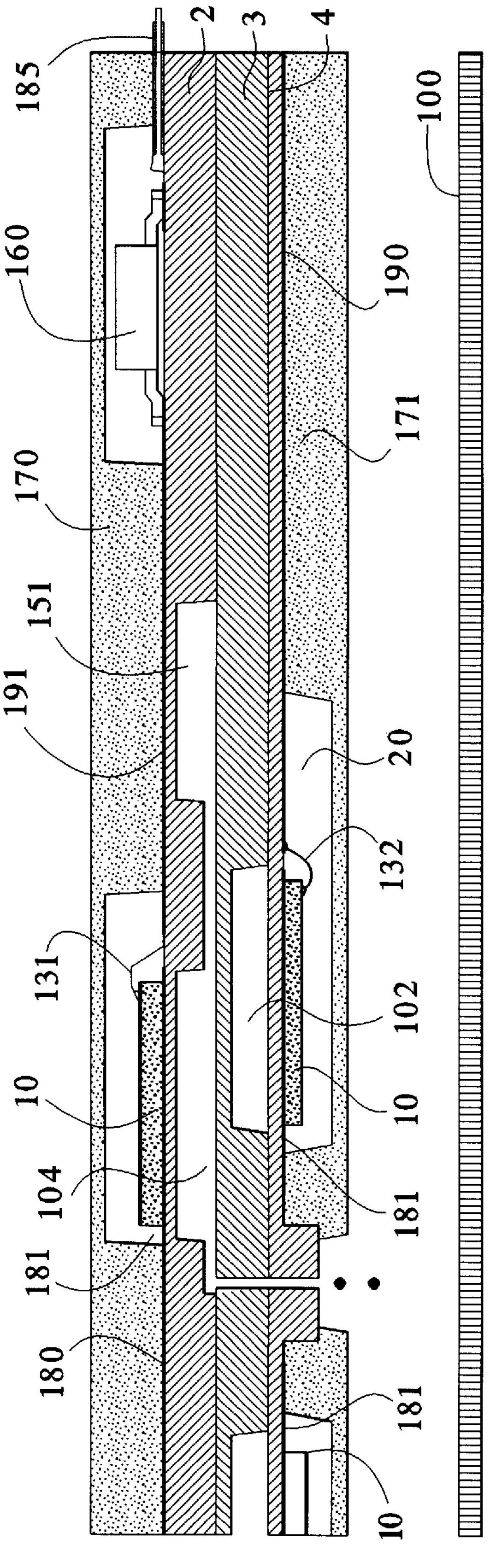
FIG. 6 shows a section along line A–A' of a part of the FSIJIL printing head according to the first version.

FIG. 6 shows a section of the inventive FSIJIL printing head according to the first version taken along the line A–A'. The circuit 160 and the actuators 10 are protected against environmental influences by exterior shaped plastic parts 170 and 171. The PZT elements are connected to conductor runs 190 and 191 via bond wires 131 and 132, the runs 190 and 191 leading to the aforementioned driver circuit 160. A ribbon cable 185 produces the connection to the drive electronics, for example of a postage meter machine. A defined distance is maintained between the printing head and surface 100 of the postal items to be franked.

FIG. 7*a* shows a preferred version of a method for manufacturing ink jet printing heads of the invention which includes the following steps.

Glass plate for the manufacture of differently structured module plates is processed with all of the (yet to be) module plates processed in parallel, including precision grinding and application of interconnects. The discrete module plates are separated and connected the to form at least one module with subsequent tempering. The piezoelectric actuators are applied, processed and contacted with applied interconnects. All components are assembled to form the printing head.

The advantages of the defined offset are that material properties between the individual wafers and the individual process parameters can be balanced relative to one another, i.e., all parts that are manufactured for the same printing module are derived from the same wafer and from the same process.

The manufacturing method for the FSIJIL printing head of the invention employs of a wafer of photosensitive material onto which a mask is applied. After being exposed with ultraviolet light, a phase conversion of amorphous material into its crystalline phase is effected at the exposed locations on the basis of a thermal treatment. Crystalline material is then eroded layer-by-layer by etching, as disclosed in U.S. Pat. No. 4,092,166.

First, all module plates are simultaneously processed while still part of the glass plate. Known processing steps of etching and precision grinding are conducted. Differing from the manufacture of an FSIJIL printing head as proposed in pending U.S. application Ser. No. 08/10,449, there is no specific processing of selected chamber parts.

Etchants having different concentration and/or different acting times are utilized for the three regions in order to be able to remove the corresponding regions with different depth precision. The depth precision when etching the regions for through-bores is less than when etching extremely flat regions for the channels in the chamber parts, as a result of which the through-bores are etched first, then the chambers and then the nozzle channels. The thickness of the base layer is monitored when etching the chambers and that the thickness of the base layer (diaphragm) of the chambers required for ending the manufacture of the chambers is achieved by precision grinding of each and every one of the chamber parts.

Before separation into individual chamber plates or nozzle plates, an application of the interconnects (conductor runs) ensues. The interconnects are preferably produced by sputtering; however, other methods such as standard photoresist and metallization methods are suitable. Methods that are not affected by a following tempering process are employed insofar as possible. German OS 37 33 109 discloses that platinum or metals of the platinum group that resist a sintering process up to 1300° C. can be utilized.

The discrete parts are united in a module, whereby the discrete parts are aligned. After the discrete parts are joined to one another, a module has arisen that is subsequently tempered. A phase transition from amorphous to crystalline occurs in the glass material during tempering.

This is followed by the application of further electrical interconnects onto the chamber surface, the application of the piezo-crystals and the contacting in known ways. The piezo-crystals can be individually glued on with subsequent curing of the glue. Alternatively, a layer of piezoelectric material that is structured and contacted later can be applied onto that chamber surface provided with interconnects. It is provided that the PZT layer is first separated into individual PZT elements. To this end, laser beam processing is preferably utilized. A contacting of the PZT elements by wire bonding ensues after the application of further interconnects sputtering.

Finally, it is also possible to metalize a pre-treated PZT plate and to apply it onto the second chamber plate, or nozzle plate. The application can advantageously ensue by gluing. Subsequently, a plurality of individual PZT elements are separated for each module. As warranted, the PZT elements are contacted by further interconnects after the application.

FIG. 8 shows a fifth version for the structure of an ink jet printing head wherein the ink chambers of the second chamber plate were arranged structured from the opposite side. An additional cover plate that terminates the ink chambers in the downward direction is not required in this case. Instead, a middle plate is utilized for the tight termination of the ink chambers.

It can be seen that it is only the nozzle dimensions that define the maximum plurality of nozzles in the row. A further printing module must be arranged if there is a demand for increased resolution.

Inventively, the chamber parts for the lower levels are manufactured simultaneously with those for the upper level and simultaneously with the spacer parts, or the nozzle plate, being manufactured of a common glass plate.

In the sixth version, chamber plates with nozzle rows 1 and 8 lying offset side-by-side in one level are provided, these respectively belonging to a different block. It is not necessary to separate the two chamber plates from one another.

Differing therefrom, for example, U.S. Pat. No. 4,703,333 discloses a block structure having blocks that can be taken apart, whereby the individual blocks must be exactly adjusted. This disadvantage can be inventively avoided on the basis of combinations of identical chamber plates, or nozzle plates, interrelated in one level. The required offset between the chamber plates in one level is assured with highest precision on the basis of the lithographic process implemented before the etching.

FIG. 9 shows the arrangement of the interconnects on the nozzle side of a FSIJIL printing head of the sixth version fabricated on the basis of the aforementioned manufacturing method with nozzle rows 1 and 8.

Figure 7B:
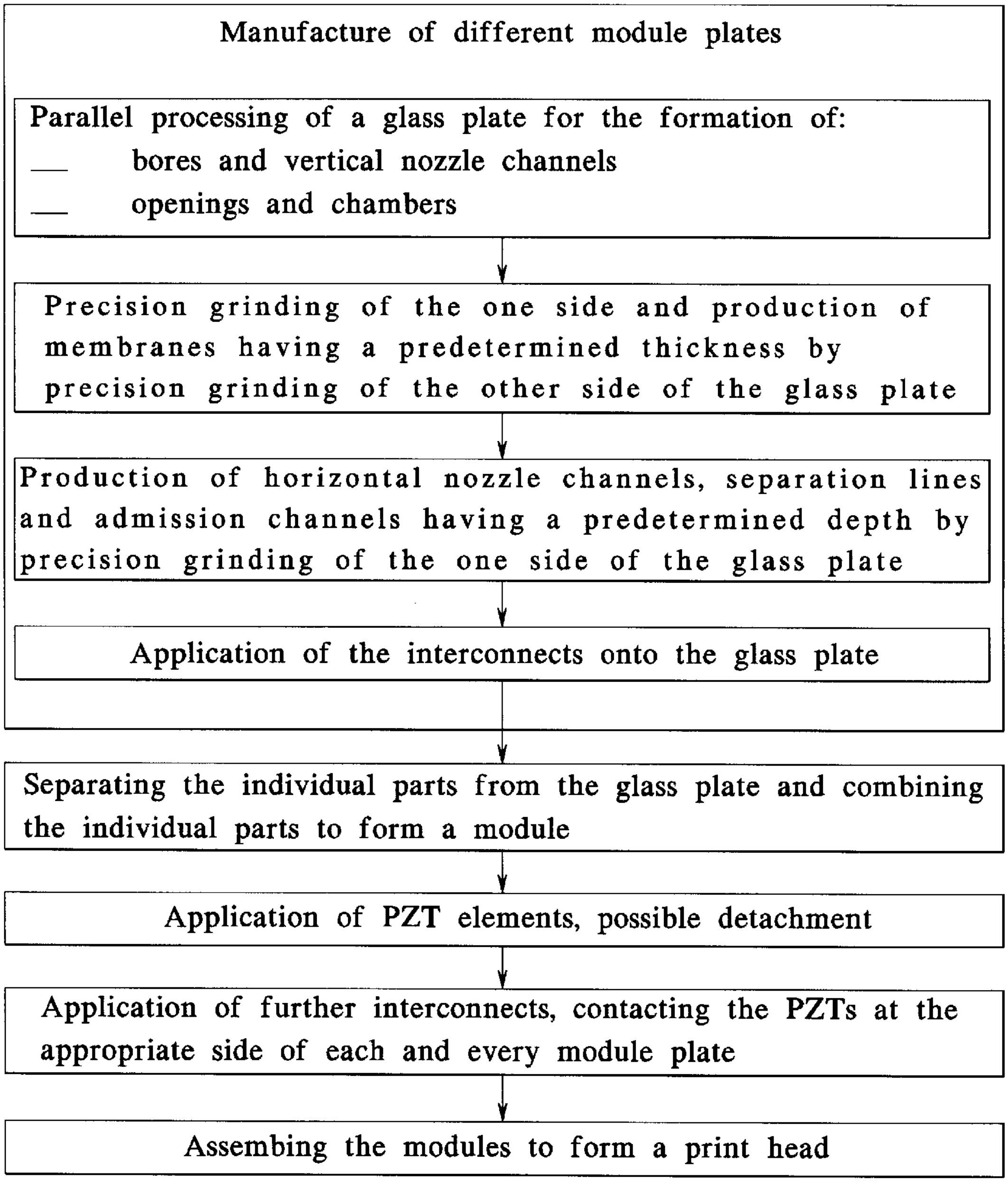
FIG. 7*b* is a flow chart for a second version of the manufacturing method for the FSIJIL printing head of the invention.

FIG. **7*b* shows flow chart a method for manufacturing ink jet printing heads in a further version. FIG. 7*b*** shows the following steps.

Glass plate for manufacturing differently structured module plates is processed with all of the (yet to be) module plates processed in parallel. In alternation and before a separation in a level of interrelated combinations of identical chamber plates or nozzle plates, an etching and a precision grinding and, additionally, an application of interconnects (by sputtering) ensue in a plurality of steps. The individual parts are separated and joined to form at least one module with subsequent tempering. Piezoelectric elements are applied, processed and contacted with applied interconnects. The parts are assembled to form the printing head.

Differing from the version according to FIG. **7*a***, through-bores and vertical nozzle channels in non-through openings and chambers are first simultaneously produced. On the basis of multiple exposure (through exposure) and thermal treatment, first regions, for example through nozzle channels, are pre-treated for etching. By contrast thereto, second regions, for example chambers, are exposed only up to a predetermined depth. Beginning with this depth, the etching rate in the second regions is reduced in comparison to in the first regions. A pre-treatment of the plate surface by precision grinding and exposure with ultraviolet light as well as subsequent thermal treatment ensue before the etching of horizontal ink channels.

The application of PZT elements can ensue in the following way.

A first, pre-treated PZT plate is metallized and applied onto the diaphragm of the spacer part (if present) or nozzle plate. Subsequently, a plurality of individual PZT elements are separated for each module. A second, pre-treated PZT plate is metallized and applied onto the second chamber plate. Subsequently, a plurality of individual PZT elements are separated for each module. Thereafter, the individual chamber parts, the spacer part, or for the nozzle plate of each module are separated.

The assembling to form the printing head can ensue in the following way for all of the aforementioned versions of the manufacturing method.

The nozzles are cleaned with compressed air. The chambers and the nozzles are cleaned and rinsed. A hydrophilic inside coat arises due to rinsing with a first, suitable, commercially obtainable liquid. A hydrophobic outside coating is achieved by treating the nozzle plate with a second, suitable liquid on the printing side. After the hardening of the upper layer, the nozzles are finished. The module is provided with the required driver circuits on that side of the module facing away from the printing side and the module is provided with a protective housing. The module is combined with further components required for the operation thereof (e.g., electrical, mechanical and ink supply means). A printing head test also ensues at the conclusion.

In the contacting before the separating, it is preferable that the middle parts can also be provided with interconnects. For example, the module plates can be coated with a metal by sputtering. As a result, a line guidance (path) from the other layers to the upper layers of the module can ensue free of cross-overs, particularly when a great number of elements are to be contacted. The individual module parts are joined to one another in alignment and are tempered, whereby a phase transition from amorphous to crystalline ensues. It is provided that spacer parts lie, or are additionally arranged, between the modules and that the spacer parts are manufactured of the plate material, whereby a structuring on the basis of etching ensues.

Figure 7C:
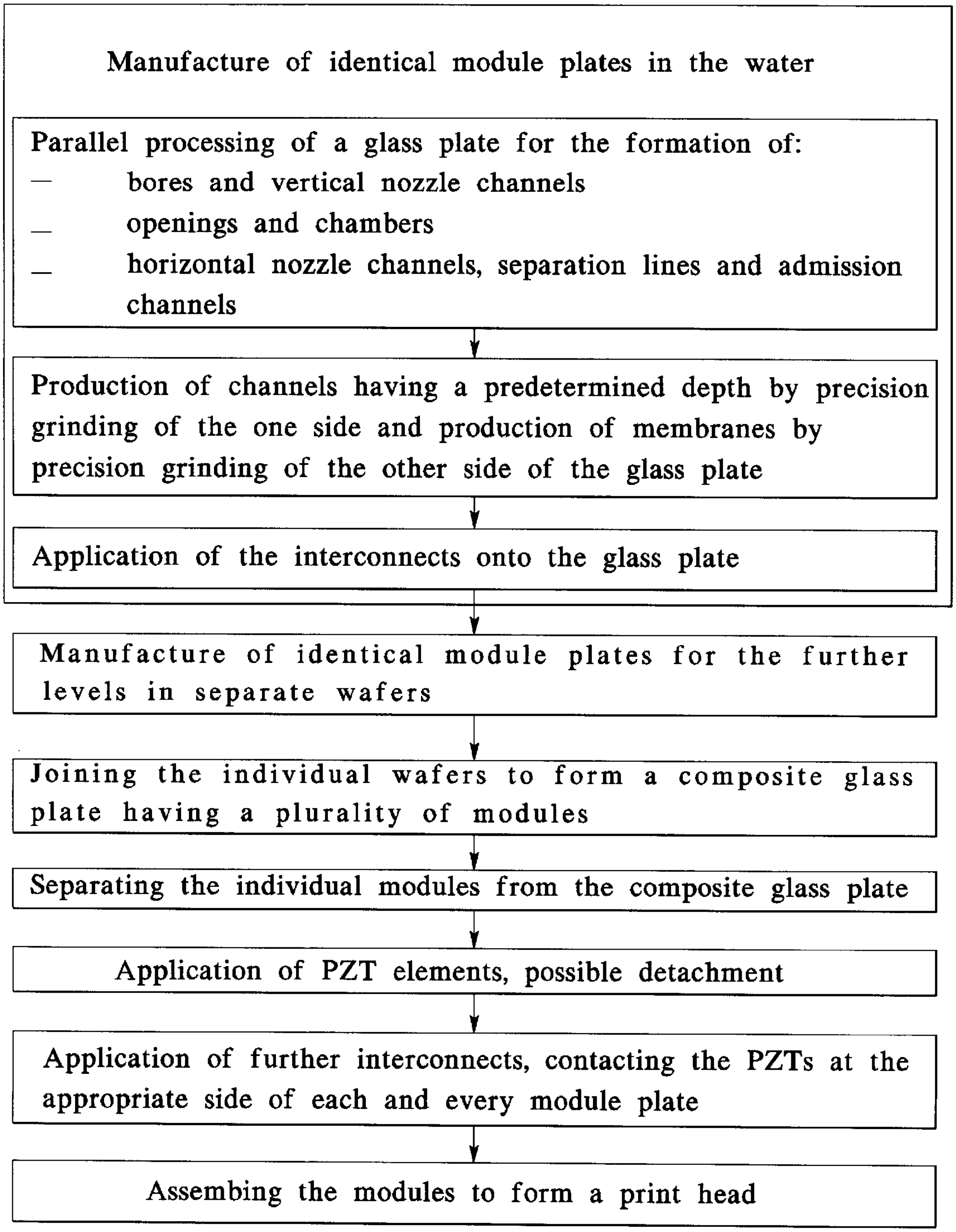
FIG. 7*c* us a flow chart for a third version of the manufacturing method for the FSIJIL printing head of the invention.

In conclusion, the printing head is accommodated in a housing before it is tested for functionability in order to eliminate faulty units. FIG. 7*c* shows a further manufacturing method, wherein each wafer comprises only one module plate type and the wafers are joined above one another, and a large-area diffusion bonding is employed. Only after this step is separation into a plurality of modules undertaken, these being then separately further-processed. This is facilitated by connecting the individual module plates to one another only via webs which can be easily separated (broken), preferably by sawing. The webs are previously manufactured in the first method step during etching.

A further enhancement of the print density can be achieved by a standard oblique positioning of the module relative to the printing direction.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for manufacturing an ink jet printing head comprising the steps of:

parallel processing a first single glass plate to form a first module plate set comprising a plurality of identical module plates, including forming a plurality of bores in each of said module plates of said first set in said first single glass plate and forming at least one vertical nozzle channel in at least some of said module plates in said first set in said first single glass plate, forming ink chambers in at least some of said module plates in said first set in said first single glass plate, and applying electrical connections to at least some of said module plates in said first set in said first single glass plate;

parallel processing a second single glass plate to form a second module plate set comprising a plurality of identical module plates, including forming a plurality of bores in each of said module plates of said second set in said second single glass plate and forming at least one vertical nozzle channel in at least some of said module plates in said second set in said second single glass plate, forming ink chambers in at least some of said module plates in said second set in said second single glass plate, and applying electrical connections to at least some of said module plates in said second set in said second single glass plate;

joining said first and second glass plates to form a composite glass plate containing a plurality of composite modules each consisting of a module plate from said first set respectively in registry with a module plate in said second set;

separating said composite modules to obtain separated composite modules, each of said separated composite modules having two exterior surfaces;

applying piezoelectric elements to at least one of said exterior surfaces of each of said separated composite modules and contacting said piezoelectric elements to said electrical interconnects on said at least one of said exterior surfaces of each of said separated composite modules; and assembling said separated composite modules to form a printing head.

2. A method for manufacturing an ink jet printing head as claimed in claim 1 wherein the step of applying electrical connections to at least some of said module plates in said first set in said first single glass plate comprises sputtering on said first single glass plate and wherein the step of applying electrical connections to at least some of said module plates in said second set in said second glass plate comprises sputtering on said second glass plate.

3. A method for manufacturing an ink jet printing head as claimed in claim 1 wherein the step of contacting said piezoelectric elements comprises wire bonding said piezoelectric elements to said electrical interconnects on said at least one of said exterior surfaces of each of said separated composite modules.

4. A method for manufacturing an ink jet printing head as claimed in claim 1 comprising the additional step of applying further electrical connections to said piezoelectric elements on each of said at least one of said exterior surfaces of each composite modules after applying said piezoelectric elements and before assembling said separate composite modules to form a printing head.

5. A method for manufacturing an ink jet printing head as claimed in claim 4 wherein the step of applying further electrical connections comprises sputtering on said at least one of said exterior surfaces of each of said separated composite modules.

* * * * *